United States Patent
Hsu et al.

(10) Patent No.: US 7,494,846 B2
(45) Date of Patent: Feb. 24, 2009

(54) DESIGN TECHNIQUES FOR STACKING IDENTICAL MEMORY DIES

(75) Inventors: Chao-Shun Hsu, San-Shin (TW); Louis Liu, Hsin-Chu (TW); Clinton Chao, Hsin-Chu (TW); Mark Shane Peng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 89 days.

(21) Appl. No.: 11/716,104

(22) Filed: Mar. 9, 2007

(65) Prior Publication Data

US 2008/0220565 A1 Sep. 11, 2008

(51) Int. Cl.
*H01L 21/8242* (2006.01)
(52) U.S. Cl. ............... 438/109; 438/455; 257/E25.027; 257/E21.614; 257/E23.179; 257/E21.513
(58) Field of Classification Search ................ 257/684, 257/777, E25.027, E21.614, E23.179, E21.513; 438/109, 455, 18
See application file for complete search history.

(56) References Cited

U.S. PATENT DOCUMENTS

| | | | |
|---|---|---|---|
| 5,448,511 A | 9/1995 | Paurus et al. | |
| 6,156,579 A * | 12/2000 | Khatri et al. | 438/16 |
| 6,226,394 B1 * | 5/2001 | Wilson et al. | 382/145 |
| 6,740,981 B2 * | 5/2004 | Hosomi | 257/778 |
| 6,941,536 B2 * | 9/2005 | Muranaka | 716/14 |
| 7,046,522 B2 * | 5/2006 | Sung et al. | 361/803 |
| 7,062,346 B2 * | 6/2006 | Takagi et al. | 700/116 |
| 2004/0095172 A1 * | 5/2004 | Usami | 327/143 |
| 2004/0225385 A1 * | 11/2004 | Takagi et al. | 700/90 |
| 2005/0082664 A1 * | 4/2005 | Funaba et al. | 257/724 |
| 2005/0263605 A1 * | 12/2005 | Muranaka | 235/492 |

* cited by examiner

*Primary Examiner*—George Fourson
(74) *Attorney, Agent, or Firm*—Slater & Matsil, L.L.P.

(57) ABSTRACT

A semiconductor structure includes a first semiconductor die and a second semiconductor die identical to the first semiconductor die. The first semiconductor die includes a first identification circuit; and a first plurality of input/output (I/O) pads on the surface of the first semiconductor die. The second semiconductor die includes a second identification circuit, wherein the first and the second identification circuits are programmed differently from each other; and a second plurality of I/O pads on the surface of the second semiconductor die. Each of the first plurality of I/O pads is vertically aligned to and connected to one of the respective second plurality of I/O pads. The second semiconductor die is vertically aligned to and bonded on the first semiconductor die.

16 Claims, 5 Drawing Sheets

US 7,494,846 B2

DESIGN TECHNIQUES FOR STACKING IDENTICAL MEMORY DIES

TECHNICAL FIELD

This invention relates generally to integrated circuits, and more particular to manufacturing and packaging techniques for forming stacked memory dies.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, which allow more components to be integrated into a given chip area.

These integration improvements are essentially two-dimensional (2D) in nature, in that the volume occupied by the integrated components is essentially on the surface of the semiconductor wafer. Although dramatic improvement in lithography has resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Among the efforts for resolving the above-discussed limitations, three-dimensional integrated circuit (3DIC) and stacked dies are commonly used. Through-silicon vias (TSV) are often used in 3DIC and stacked dies. FIG. 1 illustrates a conventional semiconductor package including stacked dies, wherein TSVs 4 are formed in the dies. Dies 10 and 12 each comprise semiconductor substrate 2, on which integrated circuits (not shown) are formed. TSVs 4 penetrate through semiconductor substrate 2, and are connected to the integrated circuits in the respective dies and bonding pads 6. Dies 10 and 12 are bonded through bonding pads 6. Further, bonding pads 6 of die 10 are used to connect die 10 to bumps 8, which are further connected to package substrate 14.

Compared to the conventional wire-bonding, TSVs are more effective in connecting multiple dies. However, when used for stacking memory dies, TSVs suffer shortcomings. Typically, in the process for forming memory dies, it is preferred to have low inventory, short cycle time, low fabrication cost (which means only one mask set is preferred), and full sharing of input/output (I/O) pads. Therefore, it is preferred that memory dies 10 and 12 have exactly the same design, and can be fabricated using a same set of masks.

Since memory dies need to have unique addresses in order to distinguish from each other, the identical memory dies cannot be simply stacked one on top of the other. Conventionally, different redistribution lines are formed for stacking dies. However, this method still needs different mask sets for forming the redistribution lines of the memory dies. Alternatively, interposers are designed. This way, the identical dies can be distinguished by attaching different interposers to dies, so that the memory dies and the attaching interposers in combination are distinguishable. Apparently, this method introduces extra cost for forming and attaching interposers.

Accordingly, what is needed in the art is a semiconductor structure and methods for forming the same that take advantage of stacked memory dies, while at the same time incurring as low cost as possible.

SUMMARY OF THE INVENTION

In accordance with one aspect of the present invention, a semiconductor structure includes a first semiconductor die and a second semiconductor die identical to the first semiconductor die. The first semiconductor die includes a first identification circuit; and a first plurality of input/output (I/O) pads on the surface of the first semiconductor die. The second semiconductor die includes a second identification circuit, wherein the first and the second identification circuits are programmed differently from each other; and a second plurality of I/O pads on the surface of the second semiconductor die. Each of the first plurality of I/O pads is vertically aligned to and connected to one of the respective second plurality of I/O pads. The second semiconductor die is vertically aligned to and bonded on the first semiconductor die.

In accordance with another aspect of the present invention, a semiconductor structure includes a first memory die and a second memory die. The first memory die includes a first identification circuit comprising at least one first programmable element; at least one first chip-select pad on a first side of the first memory die, wherein each of the at least one first chip-select pad is connected to one of the at least one first programmable element; at least one second chip-select pad on a second side of the first memory die opposite the first side of the first memory die, wherein each of the at least one second chip-select pad is vertically aligned to and electrically connected to one of the at least one first chip-select pad through a through-silicon via; a first plurality of I/O pads on the first side of the first memory die; and a second plurality of I/O pads on the second side of the first memory die, wherein each of the second plurality of I/O pads is vertically aligned to and electrically connected to one of the first plurality of I/O pads through a through-silicon via. The second memory die is identical to the first memory die. The second memory die includes a second identification circuit comprising at least one second programmable element programmed differently from the at least one first programmable element; at least one third chip-select pad on a first side of the second memory die, wherein each of the at least one third chip-select pad is connected to one of the at least one second programmable element; at least one fourth chip-select pad on a second side of the second memory die opposite the first side of the second memory die, wherein each of the at least one fourth chip-select pad is vertically aligned to and electrically connected to one of the at least one third chip-select pad through a through-silicon via; a third plurality of I/O pads on the first side of the second memory die; and a fourth plurality of I/O pads on the second side of the first memory die, wherein each of the fourth plurality of I/O pads is vertically aligned to and electrically connected to one of the third plurality of I/O pads through a through-silicon via, and wherein each of the fourth plurality of I/O pads is physically bonded to a respective pad in the first plurality of I/O pads.

In accordance with yet another aspect of the present invention, a method of forming a semiconductor structure includes forming a first semiconductor die and a second semiconductor die identical to the first semiconductor die. Each of the first and the second semiconductor dies includes an identification circuit; and a plurality of I/O conductive paths connected to memory circuits in the respective first and second semiconductor dies, wherein the plurality of I/O conductive paths comprises through-silicon vias. The method further includes programming the identification circuit of the second semiconductor die to a different state from the identification circuit of the first semiconductor die; and bonding the second semiconductor die onto the first semiconductor die, wherein the first and the second semiconductor dies are vertically aligned, and wherein each of the plurality of I/O conductive paths in the first semiconductor die is connected to a respective I/O conductive path in the second semiconductor die.

In accordance with yet another aspect of the present invention, a method of forming and operating a semiconductor structure includes forming a first memory die and a second memory die identical to the first memory die, wherein each of the first and the second memory dies include an identification circuit; and a plurality of conductive paths connected to memory circuits and the identification circuit, wherein each of the conductive paths comprises a first and a second I/O pads on opposite sides of the respective first and second memory dies, and wherein the first and the second I/O pads are vertically aligned. The method further includes programming the identification circuit of the first memory die; programming the identification circuit of the second memory die to a different state from the identification circuit of the first memory die; and stacking the second memory die onto the first memory die by physically bonding the second I/O pads of the second memory die to the first I/O pads of the first memory die, wherein the first and the second memory dies are vertically aligned.

The present invention provides ability for stacking identical dies without the need of redistribution lines and/or interposers. This significantly reduces the design and manufacturing cost, the inventory and cycle time.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
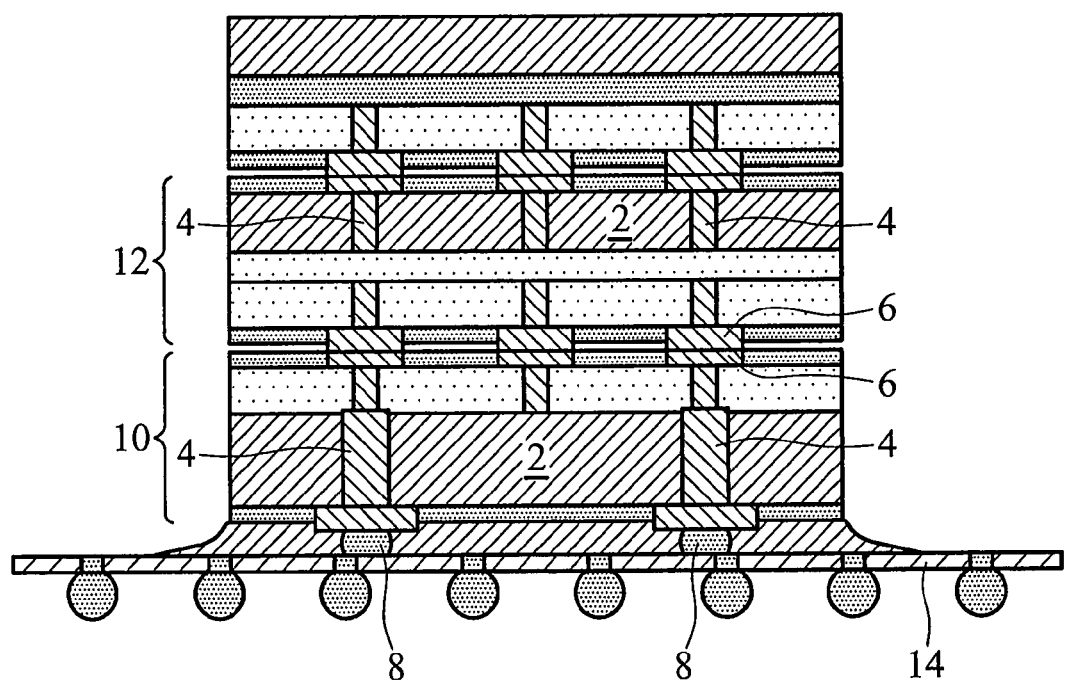
FIG. 1 illustrates a conventional structure including stacked dies.
Figure 2:
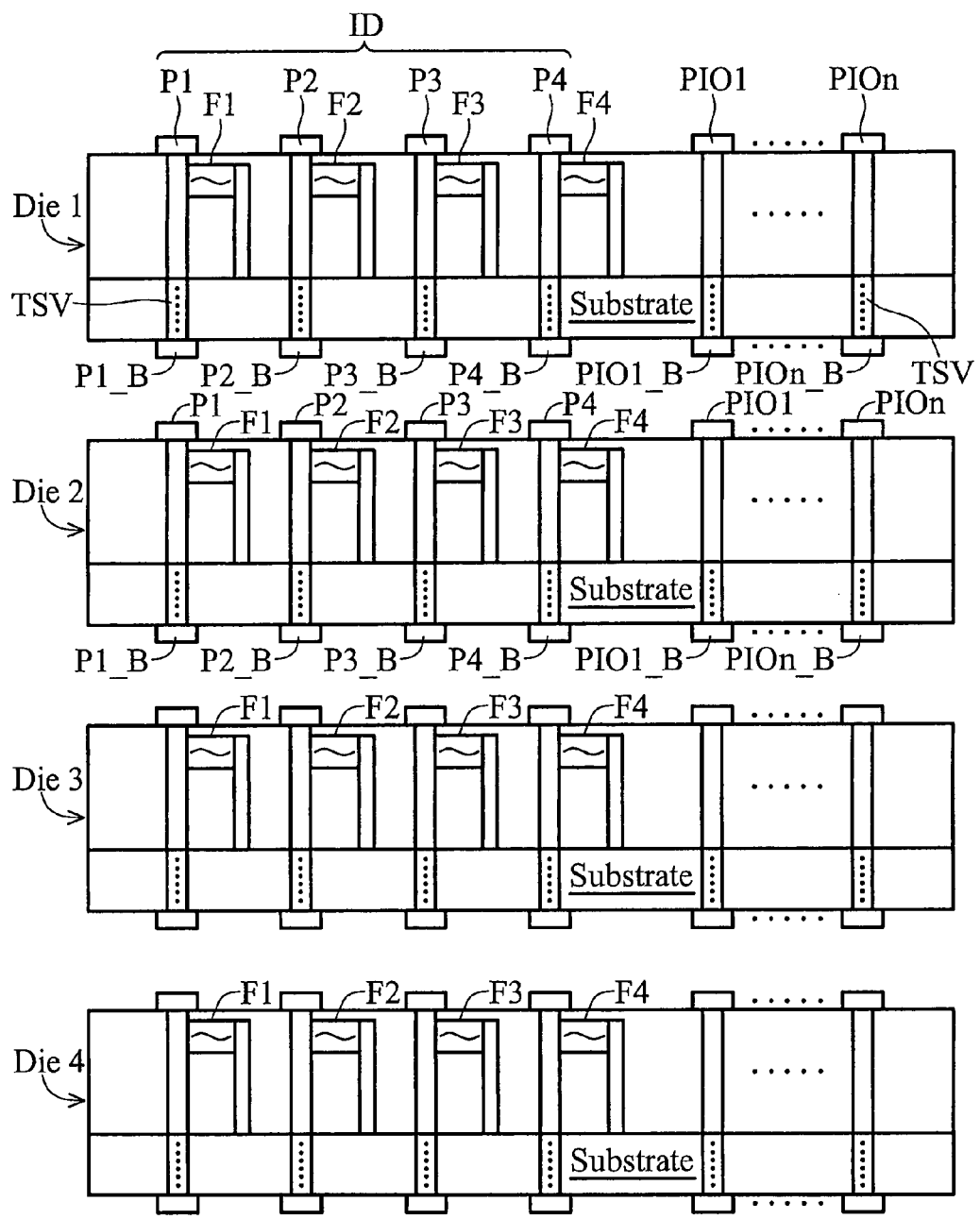
FIG. 2 illustrates four identical memory dies.

In the following discussion, an embodiment for stacking four memory dies is provided for explaining the concept of the present invention. FIG. 2 illustrates four identical dies, namely die 1, die 2, die 3 and die 4. Dies 1, 2, 3 and 4 may include commonly used memories, such as static random access memory (SRAM), dynamic random access memory (DRAM), flash memory, magnetoresistive random access memory (MRAM), and the like. Dies 1, 2, 3 and 4 may be dies sawed from a same semiconductor wafer, which includes a plurality of identical memory dies, or from different semiconductor wafers. Throughout the description, dies 1, 2, 3 and 4 are equally referred to as memory dies 1, 2, 3 and 4, although they can be non-memory cells. Accordingly, the teaching provided by the present invention may be used for stacking identical non-memory dies.

Each of dies 1, 2, 3, and 4 includes a substrate, on which integrated circuits (not shown) may be formed. A plurality of input/output (I/O) pads PIO1 through PIOn is connected to the integrated circuits. In an exemplary embodiment, the integrated circuits include memory circuits. Accordingly, the plurality of I/O pads PIO1 through PIOn may include a portion connected to the address lines (not shown), and a portion connected to the data lines. Preferably, each of the I/O pads PIO1 through PIOn is connected to a respective I/O pin PIO1_B through PIOn_B, which are on the opposite side of the die than the respective pads PIO1 through PIOn, through a through-silicon via (TSV). Further, each of the I/O pads PIO1 through PIOn is vertically aligned to the respective connecting I/O pads PIO1_B through PIOn_B.

Each of dies 1, 2, 3 and 4 includes a programmable identification (ID) circuit (denoted as ID), which comprises at least one, and likely more, programmable elements. In an exemplary embodiment, the programmable elements are fuses, which may be either electrical fuses or laser fuses, and are denoted as F1, F2, F3 and F4 in FIG. 2. Throughout the description, the programmable elements are equally referred to as fuses F1, F2, F3 and F4. However, it is to be realized that the programmable elements may be other non-volatile devices, such as flash memories, providing they can be programmed after the fabrication of the dies. Typically, flash memories have higher fabrication costs than electrical fuses and laser fuses. However, if dies 1, 2, 3 and 4 comprise flash memories as part of the memory circuits, the programmable elements may be advantageously manufactured with no additional cost. Each of the programmable elements has a first end connected to a chip-select pad on one side of the respective die, wherein the chip-select pads connected to programmable elements F1, F2, F3, and F4 are denoted as P1, P2, P3 and P4, respectively. On the opposite side of the die, chip-select pads P1_B, P2_B, P3_B and P4_B are formed, and are connected to the respective chip-select pads P1, P2, P3 and P4 through one of the TSVs. Preferably, chip-select pads P1_B, P2_B, P3_B and P4_B are vertically aligned to the connecting chip-select pads P1, P2, P3 and P4, respectively.

Figure 3:
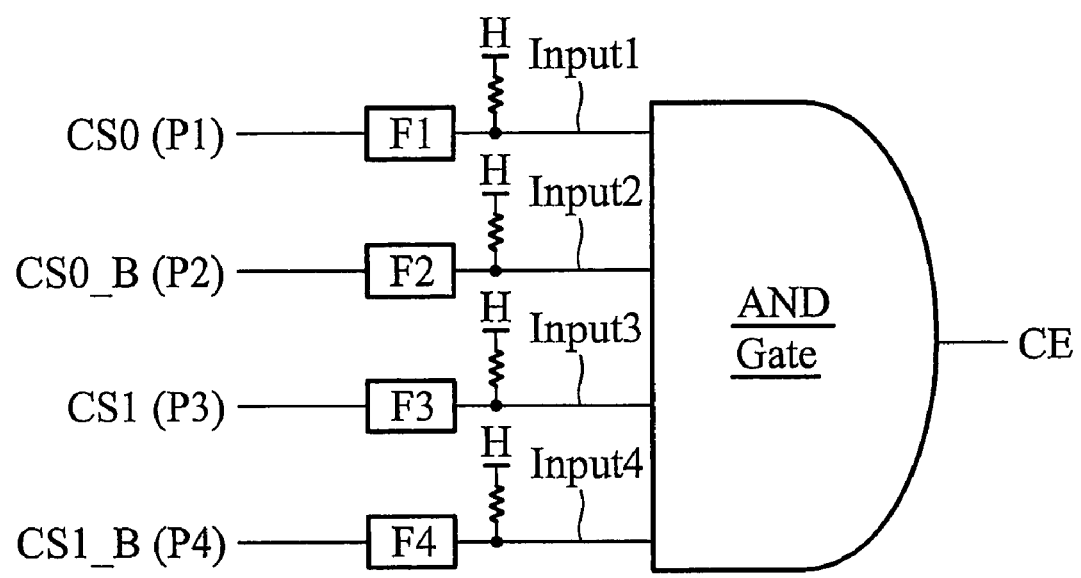
FIG. 3 illustrates an exemplary decoding circuit for distinguishing dies, wherein the decoding circuit includes an AND gate.

The second ends of the programmable elements F1, F2, F3, and F4 are connected to a decoding circuit, wherein an exemplary decoding circuit is illustrated in FIG. 3. The decoding circuit includes an AND gate, wherein the inputs Input1, Input2, Input 3 and Input4 of the decoding circuit are connected to programmable elements, and an output of the AND gate is connected to a chip-enable (CE) line for the enablement and the identification of the respective die.

The programmable elements in the ID circuit of each die are programmed differently from the programmable elements in the ID circuits of other dies. Table 1 illustrates exemplary states of the programmable elements on each of the dies 1, 2, 3 and 4, wherein the programmable elements are fuses. Letter "S" indicates that the corresponding fuse is shorted, or not blown, while letter "O" indicates that the corresponding fuse is open, or blown. Chip-select pads P1, P2, P3 and P4 are applied with signals CS0, CS0_B, CS1 and CS1_B, respectively, wherein letter "H" indicates a higher potential, and letter "L" indicates a lower potential. Signal CS0_B has an inversed phase as signal CS0, and signal CS1_B has an inversed phase as signal CS1. Therefore, the combination of the states of the fuses F1, F2, F3 and F4 acts as a unique address of the corresponding die. The illustrated states of CS0 and CS1 are the required CS0 and CS1 signals for the chip-enable CE signal of the respective die to output a high potential.

TABLE 1

|     | Die 1 | Die 2 | Die 3 | Die 4 |
| --- | --- | --- | --- | --- |
| F1  | S | S | O | O |
| F2  | O | O | S | S |
| F3  | S | O | O | S |
| F4  | O | S | S | O |
| CS0 | H | H | L | L |
| CS1 | H | L | L | H |

Referring to FIG. 3, with different signals CS0, CS0_B, CS1 and CS1_B applied, the output CE of the AND gates on dies 1, 2, 3 and 4 have different states. Using the identification circuit in die 1 as an example, assuming the input potential at node Input1 is high if fuse F1 is open, and the input potential is the same as signal CS0 if fuse F1 is shorted, then the chip-enable CE of die 1 is high when both CS0 and CS1 are high. The chip-enable CE of dies 2, 3 and 4 are also determined by the input signals CS0 and CS1. At one time, there is at most one die enabled by signals CS0 and CS1.

In the case the programmable elements are flash memories or other types, the decoding circuits are designed to output a chip-enable CE signal according to the state stored in the flash memories.

Figure 4:
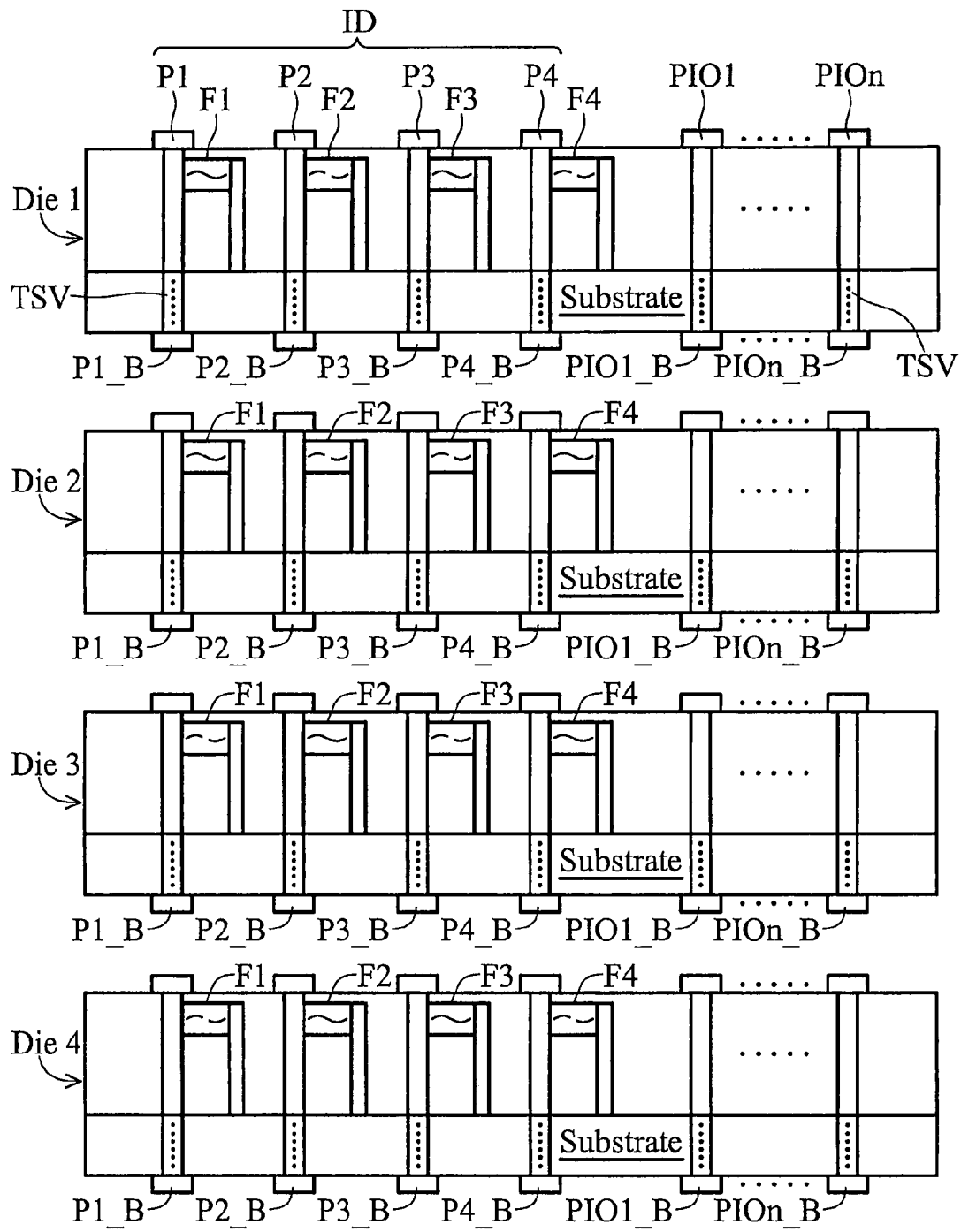
FIG. 4 illustrates four identical memory dies with their identification circuits programmed differently.

FIG. 4 illustrates the states of the programmable elements F1, F2, F3 and F4 in each of the dies 1, 2, 3 and 4, wherein the programmable elements F1, F2, F3 and F4 are programmed according to Table 1. Preferably, after the formation of each die, the dies are programmed, wherein the programming may be performed before or after the sawing of dies from the respective wafer. In the case the programmable elements are laser fuses or electrical fuses, the programmable elements are blown by a laser ray or an electrical current. In the case the programmable elements are flash memory cells, the desired states of the programmable elements are written into the flash memory cells.

Figure 5:
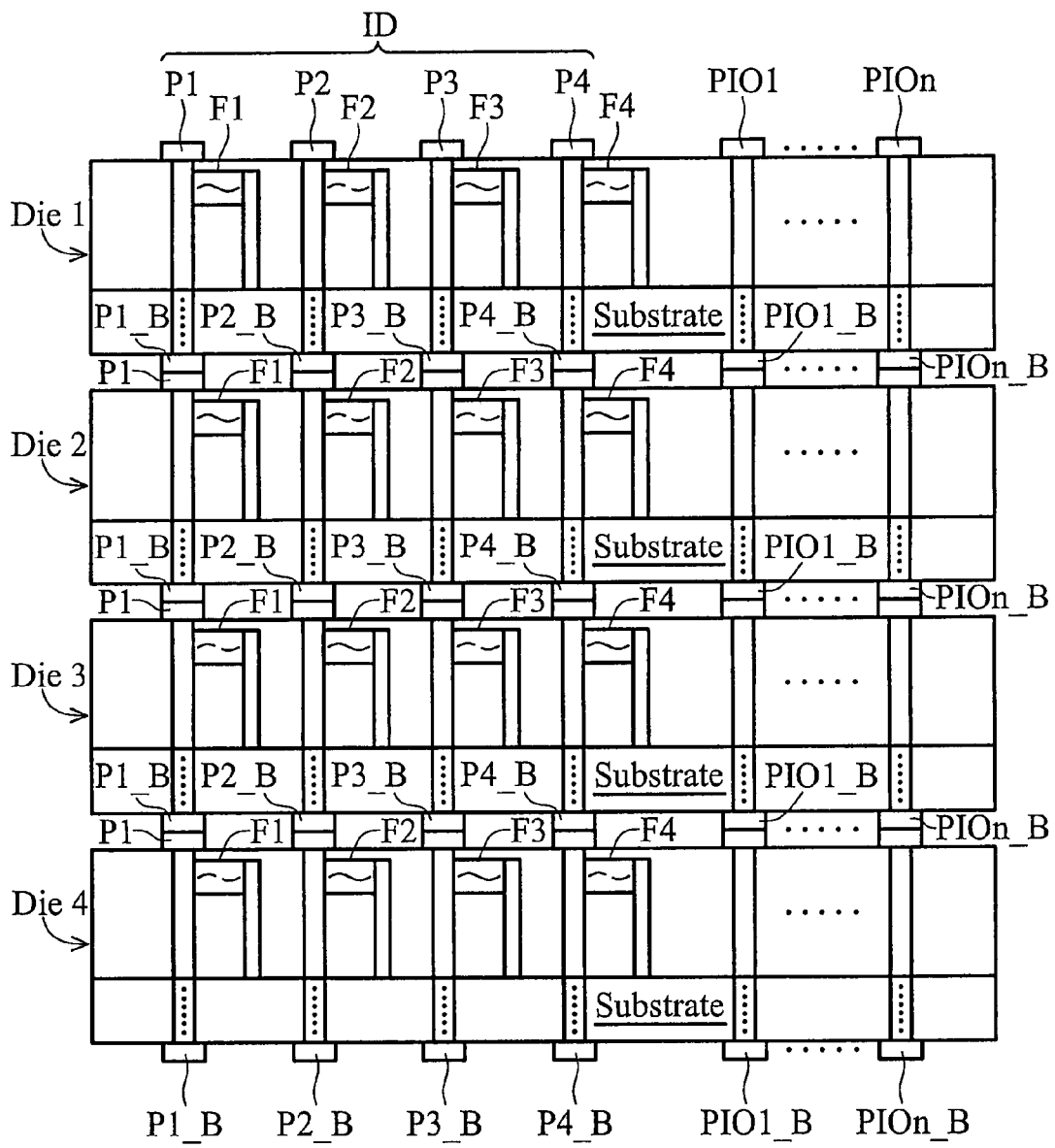
FIG. 5 illustrates the stacking of the identical memory dies.

Referring to FIG. 5, dies 1, 2, 3 and 4 are stacked, with the corresponding chip-select pads P1_B, P2_B, P3_B and P4_B bonded to chip-select pads P1, P2, P3 and P4 of the underlying dies, respectively. Further, each of the I/O pads PIO1_B through PIOn_B are bonded to I/O pads PIO1 through PIOn of the underlying die, respectively. In the preferred embodiment, copper-to-copper bonding is performed. Accordingly, each of the chip-select pads P1 through P4 on one die is connected to the respective chip-selected pads on other dies, and each of the I/O pads PIO1 through PIOn on one die is connected to respective I/O pads on other dies.

In the stack structure, even though dies 1, 2, 3 and 4 are all interconnected, the distinction may be made through chip-select pads P1, P2, P3 and P4, by applying different combinations of signals CS0, CS0_B, CS1 and CS1_B, respectively. Accordingly, each die is able to tell that the signal transferred on I/O pads PIO1 through PIOn are destined for itself or not. Similarly, external circuits connected to the stack structure can also tell the signals applied on the I/O pads are read from the memories of which die. Accordingly, by applying the chip-select signals, any of the dies 1, 2, 3 and 4 can be read from and written into as desired.

In the previous discussed embodiment, each ID circuit includes four programmable elements, which provide the ability for stacking up to 16 dies without changing the design.

One skilled in the art will realize that for uniquely identifying four or less dies, only two programmable elements are needed in each die, wherein the state combinations of (0, 0), (0, 1), (1, 0) and (1, 1) are used to uniquely identifying four dies. If more dies are to be stacked, more programmable elements may be added. If only two dies are to be stacked, one programmable element may be used, wherein each of the states 0 and 1 (or open and short state for fuses) is used to identify one die. In this case, the programming operation may be performed after the stacking of two dies, wherein the top die is programmed to a different state from the bottom die.

The stacked structure shown in FIG. 5 is referred to back-to-front stacking, wherein the backside of one die is attached to the front side of another die. In alternative embodiments, back-to-back and front-to-front stacking schemes may be used. Such stacking schemes, however, requires the dies to have symmetric structure with same types of I/O pads and chip-selected pads on exactly the same positions when a die is flipped, so that a pad (such as chip-selected pads and I/O pads) may be connected to a same type of pad on another die. In addition, one or more of the stacked dies may be thinned. For example, die 4 may have a greater thickness than dies 1, 2 and 3. In this case, the only difference between die 4 and dies 1, 2 and 3 are the thickness of substrates (hence the lengths of TSVs), and programming states of the programmable elements. Accordingly, die 4 is still considered to be identical to dies 1, 2 and 3.

In the previously illustrated examples, die-to-die stacking is performed. In other embodiments, wafer-to-wafer stacking and die-to-wafer stacking may be performed. In this case, dies on each wafer may be programmed first, and then bonded to dies on other wafers. Dies 1, 2, 3 and 4 may be bonded using solder bumps or other commonly used meanings.

The embodiments of the present invention have several advantageous features. Since the stacked dies are identical, there is no need to manufacture more than one set of memory dies with different designs. The equipment and process for manufacturing and testing are thus simplified. This not only results in the reduction in cost, but also the improvement of the inventory and cycle time. In addition, there is no need to form different redistribution lines in the stacked dies. Interposers are also not necessary.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:

forming a first semiconductor die and a second semiconductor die identical to the first semiconductor die, wherein each of the first and the second semiconductor dies comprises:
an identification circuit; and
a plurality of input/output (I/O) conductive paths connected to memory circuits in the respective first and second semiconductor dies, wherein the plurality of I/O conductive paths comprises through-silicon vias;
programming the identification circuit of the second semiconductor die to a different state from the identification circuit of the first semiconductor die; and
bonding the second semiconductor die onto the first semiconductor die, wherein the first and the second semiconductor dies are vertically aligned, and wherein each of the plurality of I/O conductive paths in the first semiconductor die is connected to a respective I/O conductive path in the second semiconductor die.

2. The method of claim 1, wherein each of the I/O conductive paths comprises a first and a second I/O pad on opposite sides of the respective first and second semiconductor dies, and wherein the first and the second I/O pads are vertically aligned.

3. The method of claim 1, wherein the step of programming the identification circuit of the second semiconductor die is performed before the step of stacking the first and the second semiconductor dies.

4. The method of claim 1 further comprising:
sawing the first semiconductor die from a first wafer; and
sawing the second semiconductor die from a second wafer.

5. The method of claim 4, wherein the steps of programming the identification circuit of the second semiconductor die and bonding the first and the second semiconductor dies are performed before at least one of the steps of sawing the first semiconductor die from the first wafer and sawing the second semiconductor die from the second wafer.

6. The method of claim 4, wherein the steps of programming the identification circuit of the second semiconductor die and bonding the first and the second semiconductor dies are performed after the steps of sawing the first semiconductor die from the first wafer and sawing the second semiconductor die from the second wafer.

7. The method of claim 1 further comprising sawing the first and the second semiconductor dies from a same wafer.

8. The method of claim 1 further comprising thinning one of the first and the second semiconductor dies.

9. The method of claim 1 further comprising:
providing a third semiconductor die identical to the first and the second semiconductor dies;
programming an identification circuit of the third semiconductor die to a different state from the identification circuits of the first and the second semiconductor dies; and
bonding the third semiconductor die onto the second semiconductor die.

10. The method of claim 1, wherein the step of programming the identification circuit of the second semiconductor die comprises blowing fuses.

11. The method of claim 1 further comprising programming the identification circuit of the first semiconductor die.

12. A method of forming and operating a semiconductor structure, the method comprising:
forming a first memory die and a second memory die identical to the first memory die, wherein each of the first and the second memory dies comprises:
an identification circuit; and
a plurality of conductive paths connected to memory circuits and the identification circuit, wherein each of the conductive paths comprises a first input/output (I/O) pad and a second I/O pad on opposite sides of the respective first and second memory dies, and wherein the first and the second I/O pads are vertically aligned;
programming the identification circuit of the first memory die;
programming the identification circuit of the second memory die to a different state from the identification circuit of the first memory die; and
stacking the second memory die onto the first memory die by physically bonding the second I/O pads of the second memory die to the first I/O pads of the first memory die, wherein the first and the second memory dies are vertically aligned.

13. The method of claim 12 further comprising applying a chip-select signal to select one of the first and the second memory dies, wherein the chip-select signal is applied to a portion of the conductive paths that are connected to the identification circuits of the first and the second memory dies.

14. The method of claim 13 further comprising reading from or writing into one of the first and the second memory dies when the chip-select signal is applied.

15. The method of claim 12, wherein the identification circuits of the first and the second memory dies comprise fuses as programming elements, and wherein the steps of programming the identification circuits of the first and the second memory dies comprise blowing selected fuses.

16. The method of claim 12, wherein the identification circuits of the first and the second memory dies comprise flash memory cells as programming elements, and wherein the steps of programming the identification circuits of the first and the second memory dies comprise writing data into selected flash memory cells.

* * * * *